US010680449B2

(12) United States Patent
Imazaki

(10) Patent No.: US 10,680,449 B2
(45) Date of Patent: Jun. 9, 2020

(54) POWER STORAGE DEVICE

(71) Applicant: KANEKA CORPORATION, Osaka (JP)

(72) Inventor: Mitsuyasu Imazaki, Settsu (JP)

(73) Assignee: KANEKA CORPORATION, Osaka-shi (JP)

(*) Notice: Subject to any disclaimer, the term of this patent is extended or adjusted under 35 U.S.C. 154(b) by 0 days.

(21) Appl. No.: 15/549,891

(22) PCT Filed: Feb. 5, 2016

(86) PCT No.: PCT/JP2016/053537
§ 371 (c)(1),
(2) Date: Aug. 9, 2017

(87) PCT Pub. No.: WO2016/129528
PCT Pub. Date: Aug. 18, 2016

(65) Prior Publication Data
US 2018/0131202 A1 May 10, 2018

(30) Foreign Application Priority Data
Feb. 10, 2015 (JP) ................. 2015-024516

(51) Int. Cl.
H02J 7/00 (2006.01)
G01R 31/385 (2019.01)
(Continued)

(52) U.S. Cl.
CPC .......... H02J 7/0026 (2013.01); G01R 31/385 (2019.01); H01M 4/13 (2013.01);
(Continued)

(58) Field of Classification Search
CPC ........................ H01M 10/052; H01M 10/0525
See application file for complete search history.

(56) References Cited

U.S. PATENT DOCUMENTS 5,741,609 A 4/1998 Chen et al.
6,316,145 B1 11/2001 Kida et al.
(Continued)

FOREIGN PATENT DOCUMENTS

CN 101048897 A 10/2007
EP 2 338 192 A1 6/2011
(Continued)

OTHER PUBLICATIONS

International Preliminary Report on Patentability and Written Opinion dated Aug. 15, 2017 in PCT/JP2016/053537.
(Continued)

Primary Examiner — David V Henze-Gongola
(74) Attorney, Agent, or Firm — Oblon, McClelland, Maier & Neustadt, L.L.P.

(57) ABSTRACT

A power storage device has a secondary battery which has a positive electrode, a negative electrode, and a nonaqueous electrolyte disposed between the positive and negative electrodes; in the secondary battery, metal ions are movable between the positive and negative electrodes through the nonaqueous electrolyte, and the positive and negative electrodes are charged/discharged when insertion/extraction reactions of the metal ions are carried out through the nonaqueous electrolyte; the positive and negative electrodes each contain an active-material layer with an average thickness of 0.3 mm or greater; the charging device is electrically connected to the secondary battery, and charges the secondary battery only at a constant current; and when the secondary battery is charged to its end-of-charge voltage by the charging device, its capacity is set to be 80% to 97% of the design capacity calculated from the inherent capacity per unit weight of the positive and negative electrodes.

19 Claims, 3 Drawing Sheets

(51) Int. Cl.
*H01M 10/44* (2006.01)
*H01M 4/13* (2010.01)
*H01M 10/46* (2006.01)
*H01M 10/48* (2006.01)
*H01M 10/0525* (2010.01)
*H01M 4/02* (2006.01)

(52) U.S. Cl.
CPC ....... *H01M 10/0525* (2013.01); *H01M 10/44* (2013.01); *H01M 10/46* (2013.01); *H01M 10/48* (2013.01); *H02J 7/0063* (2013.01); *H01M 10/441* (2013.01); *H01M 2004/021* (2013.01); *H02J 7/00302* (2020.01); *H02J 2007/0067* (2013.01)

(56) References Cited

U.S. PATENT DOCUMENTS

| | | | |
|---|---|---|---|
| 6,489,055 B1* | 12/2002 | Ichihashi | H01M 10/0565 429/188 |
| 2003/0039883 A1 | 2/2003 | Notten et al. | |
| 2006/0093894 A1* | 5/2006 | Scott | A61N 1/3787 429/50 |
| 2011/0078092 A1* | 3/2011 | Kim | B60L 50/66 705/412 |
| 2011/0183166 A1* | 7/2011 | Suga | H01M 2/30 429/61 |
| 2011/0193529 A1 | 8/2011 | Nishimura et al. | |
| 2011/0267006 A1 | 11/2011 | Tanno | |
| 2012/0112688 A1* | 5/2012 | Ho | H02J 7/0021 320/107 |

FOREIGN PATENT DOCUMENTS

| | | |
|---|---|---|
| JP | 10-312826 A | 11/1998 |
| JP | 2011-108372 A | 6/2011 |
| JP | 2011-165453 A | 8/2011 |
| JP | 2011-234526 A | 11/2011 |
| JP | 2012-190625 A | 10/2012 |
| JP | 2012-227035 A | 11/2012 |
| JP | 2013-12374 A | 1/2013 |
| JP | 2013-89523 A | 5/2013 |
| JP | 2015-11823 A | 1/2015 |
| WO | WO 2010/046745 A1 | 4/2010 |
| WO | 2014/208162 A1 | 11/2014 |

OTHER PUBLICATIONS

International Search Report dated Apr. 12, 2016, in PCT/JP2016/053537, filed Feb. 5, 2016.
Supplementary European Search Report dated Jul. 13, 2018 in European Patent Application No. 16 74 9172, 2 pages.

* cited by examiner

POWER STORAGE DEVICE

TECHNICAL FIELD

The present invention relates to a power storage device structured to have a charging device and a secondary battery.

BACKGROUND ART

In recent years, as the development of power generation systems such as photovoltaics and fuel cell systems has advanced and made off-grid power generation available, more interest has been focused on power storage devices to temporarily store privately generated electricity.

A power storage device is structured to have a secondary battery as the storage battery and to have its own charging device. The power storage device is capable of storing electricity generated by charging the secondary battery through its own charging device. When requested by an external load, the electricity charged in the secondary battery is transmitted to the external load.

For a safe charging procedure, the end-of-charge voltage is set in a secondary battery at the maximum value for charged voltage. If the voltage rises beyond the end-of-charge voltage, internal active-material layers of electrodes fall into a state of overcharge. When a secondary battery is overcharged, acceleration in damage to the secondary battery material and electrolyte decomposition on the material surfaces is known to occur, thereby causing rapid deterioration of the secondary battery. Accordingly, to achieve a long lifetime of a secondary battery, it is necessary to prevent overcharging the battery and to suppress the acceleration in material damage and electrolyte decomposition.

Meanwhile, to store electricity generated by off-grid power generation systems or the like, a relatively larger capacity and power output are required. To increase the capacity and power output, multiple secondary batteries may be connected in series to form a battery pack.

When a battery pack is used, overcharging is usually controlled pack by pack, not battery by battery within a pack. As a result, depending on the degree of deterioration or other variations between each individual battery, a certain secondary battery in the battery pack may be overcharged when charge control is performed pack by pack; in other words, controlling overcharge of a certain secondary battery in the pack is something that is yet to be solved. Therefore, when a battery pack is formed by connecting multiple secondary batteries in series, it is necessary to use secondary batteries with excellent overcharge resistance.

Considering the above, to prevent overcharge of a certain secondary battery, Patent Literature 1 proposes a battery pack structured to have multiple batteries connected in series, including a battery possessing an inflection region for detecting the depth of charge set in advance at a desired level and other batteries that are not intended for detecting the depth of charge. According to the battery pack described in Patent Literature 1, when the voltage of the battery for detecting the depth of charge reaches a specified voltage, the depth of charge of the entire battery pack is accurately detected, allowing the pack to be used within a voltage range that is kept below the overcharge.

CITATION LIST

Patent Literature

Patent Literature 1: JP2013-089523A

DISCLOSURE OF THE INVENTION

Problems to be Solved by the Invention

However, the battery pack in Patent Literature 1 utilizes an electrode active material, for the battery used in detecting the depth of charge, which is different from the material used in the batteries that are not intended for detecting the depth of charge. Thus, to manufacture the battery pack related to Patent Literature 1, it is necessary to prepare batteries for detecting the depth of charge separately from batteries not used for such a purpose, thereby making the manufacturing process complex and inefficient. Moreover, if the battery for detecting the depth of charge fails to work for some reasons, batteries that are not intended for detecting the depth of charge may be overcharged beyond the end-of-charge voltage, and the battery pack in Patent Literature 1 may become hazardous.

Accordingly, the objective of the present invention is to provide a power storage device capable of preventing overcharge while charging the device without utilizing a battery for detecting the depth of charge.

Solutions to the Problems

An aspect of the present invention to solve the aforementioned problems is a power storage device structured to have a secondary battery and a charging device for charging the secondary battery. The secondary battery is structured to have a positive electrode, a negative electrode and a nonaqueous electrolyte disposed between the positive and negative electrodes. In the secondary battery, metal ions are movable between the positive and negative electrodes through the nonaqueous electrolyte, and the positive and negative electrodes are charged/discharged when insertion/extraction reactions of the metal ions are carried out through the nonaqueous electrolyte. The positive and negative electrodes each have an active-material layer with an average thickness of 0.3 mm or greater. The charging device is electrically connected to the secondary battery, and charges the secondary battery only at a constant current. When the secondary battery is charged to its end-of-charge voltage by the charging device, its capacity is set to be 80% to 97% of the design capacity calculated from the inherent capacity per unit weight of the positive and negative electrodes.

The "end-of-discharge voltage" means the minimum value of voltage to be generated in a secondary battery and controlled by a limiter, for example. In other words, it is the rated cut-off voltage for safely discharging the secondary battery.

The "end-of-charge voltage" means the maximum value of voltage to be generated in a secondary battery and controlled by a limiter, for example. Namely, it is the rated cut-off voltage for safely charging the secondary battery.

According to the present aspect, the positive and negative electrodes of a secondary battery are capable of transferring metal ions through a nonaqueous electrolyte, and are charged/discharged through insertion/extraction reactions of metal ions between the positive electrode and nonaqueous electrolyte and between the negative electrode and nonaqueous electrolyte.

In a secondary battery charged/discharged through insertion/extraction reactions, resistance components in ohmic loss (IR drop) mainly include contact resistance among materials and diffusion resistance caused when metal ions are diffused from the electrodes to the nonaqueous electrolyte.

To achieve the power output as prescribed, a secondary battery is usually designed to minimize the contact resistance and diffusion resistance so as to obtain actual capacity closer to the design capacity.

Moreover, in secondary batteries such as a lithium secondary battery, metal ions are highly reactive with oxygen and moisture in the air, and the safety of the battery may be at risk when it is in an overcharge state. Therefore, to prevent damage caused by overcharge, a constant current charge is generally performed up to a certain level, and the charge method is switched to a constant voltage charge so as not to exceed the end-of-charge voltage.

By contrast with conventional batteries, the secondary battery according to the present aspect is formed with positive and negative electrodes having thick active-material layers with an average thickness of 0.3 mm or greater so as to control its capacity at 80% to 97% of the design capacity. Namely, in the secondary battery of the present aspect, diffusion resistance is increased by intentionally setting conditions in which the rate-limiting step is the diffusion of metal ions. Accordingly, the secondary battery is controlled by the diffusion rate of its own metal ions.

The secondary battery of the present aspect is charged at a constant current to the end-of-charge voltage by a charging device under conditions that prevent voltage from exceeding design capacity. Thus, even when a charge is complete at the end-of-charge voltage, the voltage actually applied on the materials of the secondary battery is lower because of the loss incurred by increased diffusion resistance. Therefore, even if the secondary battery is overcharged beyond the end-of-charge voltage, unless the excess voltage is beyond the range of loss incurred by the increased diffusion resistance, the internal active-material layers themselves will not fall into an overcharge state. As a result, acceleration in damage to secondary battery materials and electrolyte decomposition is less likely to occur.

As described, the secondary battery of the present aspect is capable of preventing overcharge without using a battery for detecting the depth of charge since the battery does not reach the prescribed full charge capacity even at the end-of-charge voltage. Accordingly, simplified control and lower cost are achieved.

In a preferred aspect, a decrease in capacity is 2% or less of the initial capacity prior to repeating 80 charge/discharge cycles by constant current charging/discharging that completes charge or discharge in 8 hours, respectively, within the range between the end-of-discharge voltage and end-of-charge voltage.

According to the above aspect, since a decrease is 2% or less of the initial capacity of the secondary battery prior to charge/discharge cycles, capacity decrease caused by deterioration of the secondary battery is seemingly unobserved. Accordingly, the user is less likely to notice a decrease in capacity even after long-term use.

In the above aspect, it is more preferred that a decrease in capacity is 2% or less of the initial capacity prior to repeating 100 charge/discharge cycles by constant current charging/discharging that completes charge or discharge in 8 hours, respectively, within the range between the end-of-discharge voltage and end-of-charge voltage.

In a preferred aspect, a power storage device is structured to have a battery pack structured to have multiple aforementioned secondary batteries connected in series, and the charging device is set to charge secondary batteries pack by pack.

In the battery pack of the present aspect, a secondary battery will not fall into an overcharge state even if it is charged beyond the end-of-charge voltage as long as the voltage is within a certain voltage range. Accordingly, if the capacity of each secondary battery of the battery pack varies due to deterioration, individual differences and the like, it is not necessary to conduct treatment for suppressing capacity variations among secondary batteries. In other words, when the battery pack of the present aspect is formed with secondary batteries connected in series, the voltage is controlled within the pack as a whole, eliminating a process of conducting treatment for suppressing capacity variations among secondary batteries. As long as the individual batteries are connected strictly in series to form the battery pack, the charge/discharge current flowing in all the secondary batteries is always constant, and the absolute amount of charge in all the secondary batteries is always the same. Therefore, even if one of the secondary batteries has a smaller capacity due to its performance, the entire capacity and current of the pack will not be rate-controlled by that secondary battery unless its capacity decrease is beyond a certain range.

Accordingly, load concentration on the deteriorated secondary battery is prevented at each charge/discharge time, thereby extending the lifetime of the battery pack.

In a more preferred aspect, the power storage device is structured to have multiple such battery packs, and the charging device monitors and controls the voltage pack by pack when charging multiple battery packs.

According to the present aspect, since the voltage is monitored and controlled pack by pack, charging may be performed by means that accommodates each battery pack even if their charging rates are different from each other. Moreover, the present aspect is also applicable to a power storage device structured to have built-in battery packs which are formed with secondary batteries of varying types.

In a preferred aspect, the power storage device is connectable to an external power-source system, and is capable of transmitting power to the external power-source system.

Here, "external power-source systems" include both commercial gird and individual household external loads.

The above "commercial power-source systems" mean electrical infrastructure that allows for power purchased from and supplied by power companies or the like.

According to the present aspect, when the power storage device is connected in parallel with an external power-source system, power is transmitted to the external power-source system; and when the connection is turned off, transmission to the external power-source system is shut off. For example, when the power for the external power-source system is insufficient, the power storage device works as an auxiliary power source by being connected in parallel. Moreover, when functional failure or the like occurs in the power storage device, turning off the parallel connection allows the device to be safely repaired or replaced.

In a preferred aspect, the secondary battery may be discharged at a constant current or at any other discharging method.

According to the present aspect, unlike charging, since the secondary battery may be discharged at any method in addition to a constant rate, it is capable of supplying power in response to various demands. Thus, its environmental applicability is high.

In a preferred aspect, the porosity in each of the active-material layers of the secondary battery is 15% or greater.

According to the preferred aspect, since the porosity of positive-electrode and negative-electrode active-material layers is each 15% or greater, ion diffusion is not overly controlled and excellent battery characteristics are achieved.

In a preferred aspect, the nonaqueous electrolyte is prepared by dissolving a solute with a solvent, and the solvent is a carbonate.

In a preferred aspect, the solute is a compound containing lithium and halogen.

In a preferred aspect, the negative-electrode active-material layer contains at least one type of negative-electrode active materials selected from among lithium titanium oxides and compounds in which some ions of lithium titanium oxides are substituted with ions of a different metal.

In a preferred aspect, the positive-electrode active-material layer contains at least one type of positive-electrode active materials selected from among lithium manganese oxides and compounds in which some ions of lithium manganese oxides are substituted with ions of a different metal.

The above aspects may also be set as follows: a secondary battery is structured to have positive and negative electrodes each having an active-material layer capable of inserting/extracting metal ions, and to have an electrolyte sandwiched by the electrodes and capable of transferring metal ions during electrical conduction between the electrodes; on the surface of at least one of the electrodes in such a secondary battery, an active-material layer is formed to have an average thickness of 0.3 mm or greater; the secondary battery is charged only at constant current (CC); and seemingly no capacity decrease is observed during a predetermined number of charge/discharge cycles.

Effects of the Invention

According to the present invention, overcharging is prevented when a battery pack is charged, without using a battery for detecting the depth of charge.

DETAILED DESCRIPTION OF THE EMBODIMENTS

An embodiment of the present invention is described below. The present invention is defined by the scope of the claims, and any modification equivalent to and within the scope of patent claims is included in the scope of the present invention. In addition, the digits subsequent to significant digits in a numerical range should all be rounded off.

Power storage device 1 according to a first embodiment of the present invention is the type installed mainly in a structure such as a building or residence.

Power storage device 1 is capable of temporarily storing electricity transmitted from a power generation system such as a photovoltaic-cell and fuel-cell system (not shown) or from external power-source system 50 such as a commercial power-source system. In addition, power storage device 1 is also capable of supplying stored electricity to external power-source system 50 such as an external load and a commercial power-source system.

Figure 1:
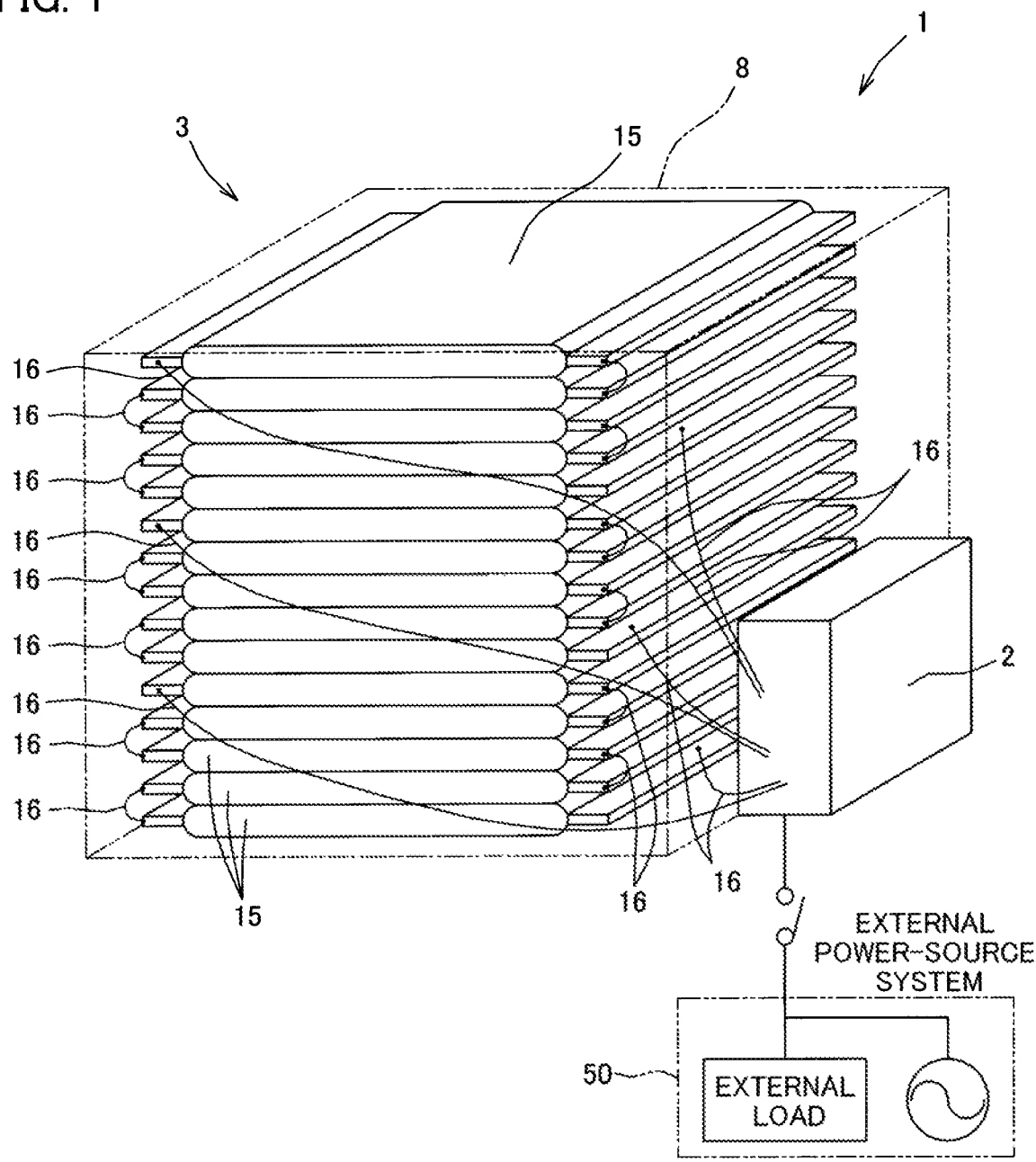
FIG. 1 is a perspective view schematically showing a power storage device related to the present invention.

As shown in FIG. 1, power storage device 1 is structured to have power-source control device 2 (charging device) and secondary battery system 3 as its main components.

One of the main characteristics of power storage device 1 of the present embodiment is that the rate of charging secondary battery 15 of secondary battery system 3 is limited by the diffusion of metal ions and that secondary battery 15 is charged only at a constant current by power-source control device 2.

In the following, each component that forms power storage device 1 is described prior to describing the characteristics of the device.

Power-source control device 2 is capable of controlling voltage and electric current, and is connectable with external power-source system 50 such as an external load and a commercial power-source system. In other words, power-source control device 2 is connectable/disconnectable in parallel with external power-source system 50.

Also, power-source control device 2 is a charging device which transmits electricity to charge secondary battery system 3, as well as a transmission device which transmits electricity charged in secondary battery system 3 to external power-source system 50.

Power-source control device 2 is capable of separately charging/discharging each of battery packs 5 of secondary battery system 3, that is, power-source control device 2 is electrically connected to each battery pack 5 through wiring member 16, and voltage of battery packs 5 is monitored and controlled pack by pack.

Figure 2:
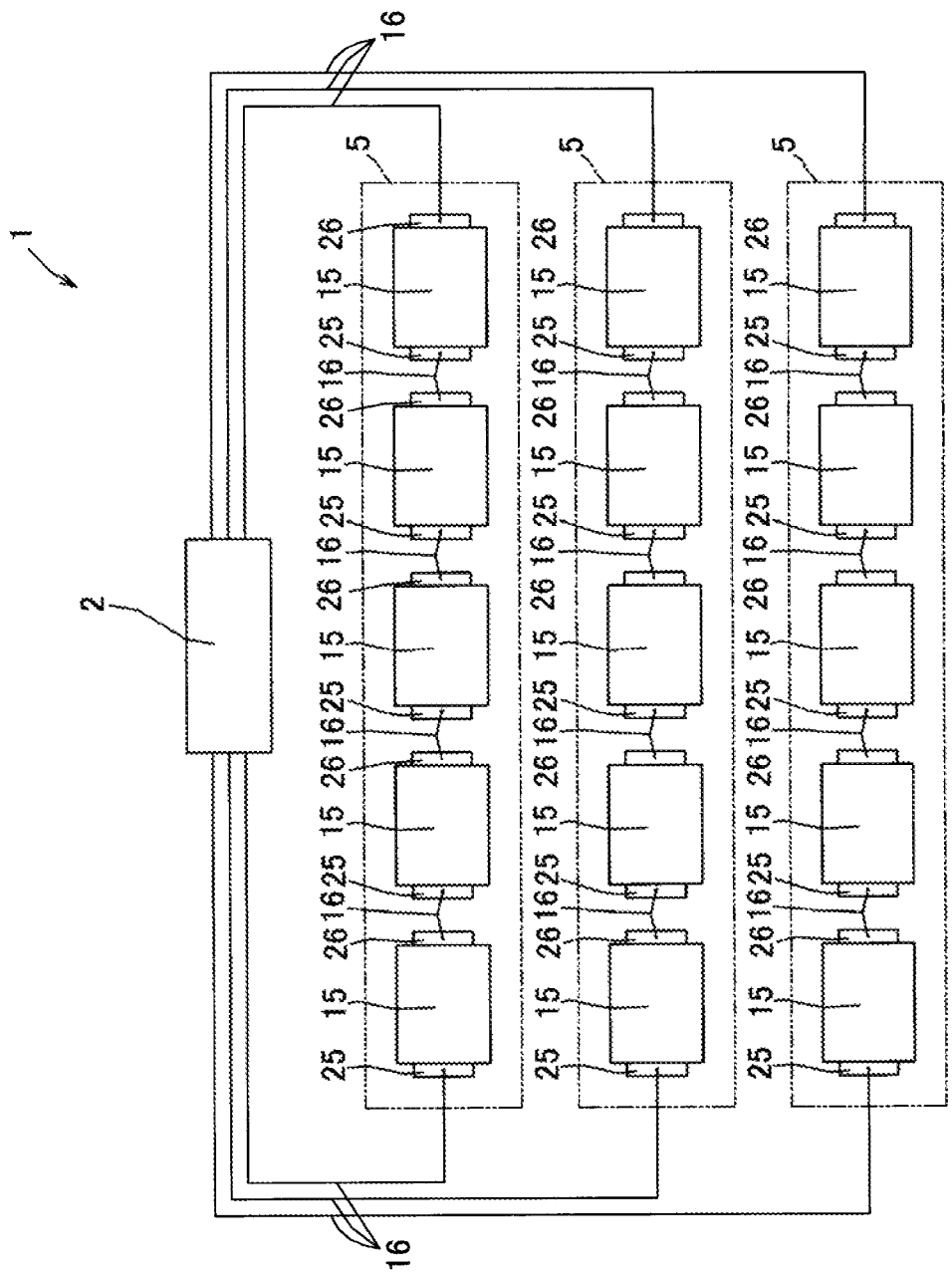
FIG. 2 is a view showing the electrical circuit of the power storage device in FIG. 1.

As shown in FIG. 1, secondary battery system 3 is structured to have multiple built-in battery packs 5 in casing 8, and each battery pack 5 is chargeable. Each battery pack 5 individually makes electrical connection with power-source control device 2 as shown in FIG. 2. Secondary battery system 3 of the present embodiment has three built-in battery packs 5 as shown in FIGS. 1 and 2.

As shown in FIGS. 1 and 2, battery pack 5 is structured to have multiple secondary batteries 15 and wiring members 16, and secondary batteries 15 are electrically connected in series through wiring members 16. In each battery pack 5 of the present embodiment, five secondary batteries 15 are electrically connected in series.

Secondary battery 15 has metal ion conductivity; more specifically, it is a lithium-ion secondary battery having lithium ion conductivity.

Secondary battery 15 is structured to have positive-electrode member 10, negative-electrode member 11 and nonaqueous electrolyte 23. In secondary battery 15, metal ions are movable between positive electrode 20 of positive-electrode member 10 and negative electrode 21 of negative-electrode member 11I. Moreover, secondary battery 15 is charged/discharged by insertion/extraction reactions of metal ions that occur between nonaqueous electrolyte 23 and positive and negative electrodes (20, 21) respectively. Namely, secondary battery 15 is charged/discharged through the migration of lithium ions as metal ions among positive electrode 20, electrolyte 23 and negative electrode 21.

In addition, terminal members (25, 26) are arranged to be extended from inside package 27 of secondary battery 15. In other words, one end of terminal members (25, 26) is connected to either positive-electrode member 10 or negative-electrode member 11 inside package 27 as shown in FIG. 4, and the other end is exposed outside package 27 as shown in FIG. 3 so that it is connectable with wiring member 16.

Moreover, package 27 encapsulating secondary batteries 15 may include a mechanism to exhaust gas or the like generated in the battery. Also, secondary battery 15 may have a mechanism to inject an additive from outside battery 15 for restoring functions of the battery when its performance is lowered. The number of stacked secondary cells 17 may be appropriately determined to express the desired battery capacity. Pressure may be applied on electrodes (20, 21) in their stack direction; pressure may also be exerted from inside secondary battery 15 or from above package 27.

Figure 3:
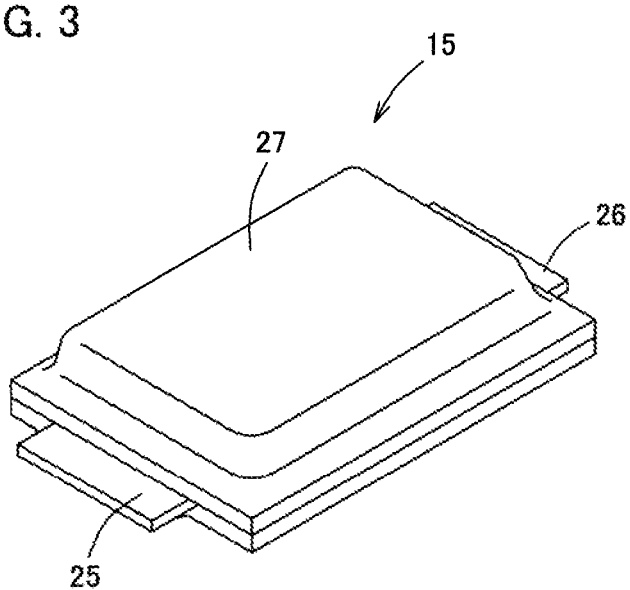
FIG. 3 is a perspective view schematically showing a secondary battery in FIG. 1.
Figure 4:
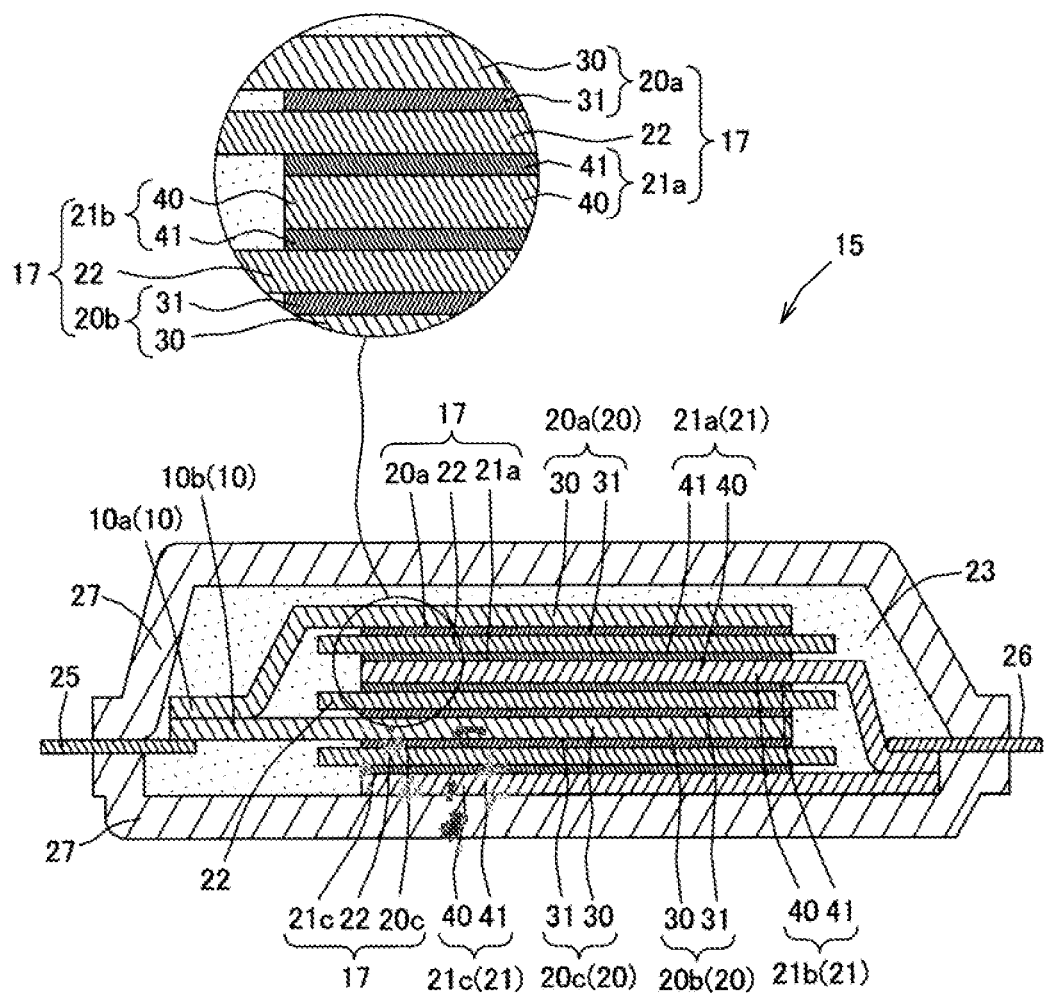
FIG. 4 is a cross-sectional view of the secondary battery in FIG. 3.

As shown in FIGS. 3 and 4, secondary battery IS of the present embodiment is structured to have multiple secondary cells 17 built into package 27.

As shown in FIG. 4, secondary cell 17 is a stack formed by stacking positive electrode 20, negative electrode 21 and separator 22; that is, secondary cell 17 is a portion where positive electrode 20 and negative electrode 21 are sandwiching separator 22 containing electrolyte 23.

(Positive-Electrode Member)

Positive-electrode member 10 is a plate- or film-type electrode member and positive electrode 20 is arranged on either or both of its surfaces.

Positive electrode 20 includes active-material layer 31 capable of inserting/extracting metal ions. Positive-electrode active-material layer 31 is formed on either or both surfaces of plate- or film-type current collector 30. Namely, positive electrode 20 is part of positive-electrode member 10, and is where positive-electrode active-material layer 31 is formed on current collector 30.

Secondary battery 15 of the present embodiment is structured to have two positive-electrode members 10 (10a, 10b), which further include multiple positive electrodes (20a-20c).

In positive-electrode member (10a), positive-electrode active-material layer 31 is formed on either surface of current collector 30 to form positive electrode (20a). In positive-electrode member (10b), positive-electrode active-material layers (31, 31) are formed respectively on both surfaces of current collector 30 to form positive electrodes (20b, 20c).

In other words, positive-electrode member (10a) is a single-sided electrode, and positive-electrode member (10b) is a double-sided electrode.

(Positive-Electrode Active-Material Layer)

Positive-electrode active-material layer 31 is formed to contain a positive-electrode active material as its primary component and may contain a conductive additive and/or a binder if applicable.

Positive-electrode active-material layer 31 of the present embodiment contains a positive-electrode active material as its main component and additionally contains a conductive additive and a binder.

The "primary component" above means the component that characterizes its capability.

Also, the "main component" means it is contained in an amount 50% or more of the entire content.

The main component of a positive-electrode active material is preferred to be one or more materials selected from among lithium manganese oxides, lithium iron phosphate, lithium manganese phosphate, and lithium manganese oxides obtained by replacing part of the manganese with a different element. By so setting, deterioration of materials is reduced even when a rapid voltage rise occurs during the latter period of charging.

The main component of a positive-electrode active material is more preferred to be one or more materials selected from among lithium manganese oxides and lithium manganese oxides obtained by replacing part of the manganese with a different element. It is especially preferable if some manganese is replaced with one or more ions of a metal selected from among nickel, aluminum, magnesium, titanium, chromium, cobalt and iron, considering their excellent resistance to overcharge.

Positive-electrode active-material layer 31 formed on a surface of current collector 30 has an average thickness of 0.3 mm or greater.

When positive-electrode active-material layer 31 has an average thickness of 0.3 mm or greater, diffusion of metal ions is likely to limit rate of progress in charge reactions, and the voltage exerted on active-material layer 31 stays below the end-of-charge voltage even after secondary battery 15 reaches the end-of-charge voltage. Accordingly, secondary battery 15 will not be overcharged beyond the end-of-charge voltage, and damage to battery material and accelerated decomposition of electrolyte 23 is suppressed.

For positive-electrode active-material layer 31 formed on a surface of current collector 30, its average thickness is preferred to be 1.5 mm or less.

Within the above range, even when the rate of charging is limited by ion diffusion, the capacity when charged to the end-of-charge voltage will not be excessively low relative to the design capacity calculated from the inherent capacity per unit weight of positive electrode 20.

The porosity of positive-electrode active-material layer 31 is preferred to be 15% to 60%, more preferably 15% to 40%.

A porosity lower than 15% in positive-electrode active-material layer 31 may inhibit ion diffusion, and excellent battery characteristics are hard to obtain.

On the other hand, a porosity beyond 60% in positive-electrode active-material layer 31 may cause contact failure between active materials or between active material and conductive additive, and battery characteristics may be lowered.

Moreover, since a greater porosity lowers the volumetric energy density, the above range is preferable.

(Negative-Electrode Member)

Negative-electrode member 11 is an electrode member shaped to be a plate or film, and negative electrode 21 is formed on either or both of its surfaces.

Negative electrode 21 includes active-material layer 41 capable of inserting/extracting metal ions. Negative-electrode active-material layer 41 is formed on either or both surfaces of plate- or film-type current collector 40. Namely, negative electrode 21 is part of negative-electrode member 11, and is where negative-electrode active-material layer 41 is formed on current collector 40.

Secondary battery 15 of the present embodiment is structured to have two negative-electrode members 11 (11a, 11b), which further include multiple negative electrodes (21a-21c).

In negative-electrode member (11a), negative-electrode active-material layers (41, 41) are formed respectively on both surfaces of current collector 40 to form negative electrodes (21a, 21b). In negative-electrode member (11b), negative-electrode active-material layer 41 is formed on either surface of current collector 40 to form negative electrode (21c). In other words, negative-electrode member (11a) is a double-sided electrode, and negative-electrode member (11b) is a single-sided electrode.

Negative electrode (21a) is the opposing electrode to positive electrode (20a) of positive-electrode member (10a), while negative electrode (21b) is the opposing electrode to positive electrode (20b) of positive-electrode member (10b). Moreover, negative electrode (21c) is the opposing electrode to positive electrode (20c) of positive-electrode member (10b).

(Negative-Electrode Active-Material Layer)

Negative-electrode active-material layer 41 is formed to contain a negative-electrode active material as its primary component and may contain a conductive additive and/or a binder if applicable.

Negative-electrode active-material layer 41 of the present embodiment contains a negative-electrode active material as its main component and additionally contains a conductive additive and binder.

The main component of a negative-electrode active material is preferred to be a titanium-containing oxide, molybdenum oxide, niobium oxide or tungsten oxide.

The main component of the negative-electrode active material is more preferably one or more materials selected from among lithium titanium oxides and lithium titanium oxides obtained by replacing part of titanium of lithium titanium oxides with ions of a different metal. It is especially preferable if the ions of a different metal are niobium ions since excellent overcharge resistance and effect of extended battery lifetime are achieved.

Negative-electrode active-material layer 41 formed on a surface of current collector 40 has an average thickness of 0.3 mm or greater When negative-electrode active-material layer 41 has an average thickness of 0.3 mm or greater, diffusion of metal ions is likely to limit the rate of progress in charge reactions, and the voltage exerted on active-material layer 41 stays below the end-of-charge voltage even after secondary battery 15 reaches the end-of-charge voltage. Accordingly, secondary battery 15 will not be overcharged beyond the end-of-charge voltage, thus preventing damage to battery material and accelerated decomposition of electrolyte 23.

For negative-electrode active-material layer 41 formed on a surface of current collector 40, its average thickness is preferred to be 1.5 mm or less.

Within the above range, the capacity when charged up to the end-of-charge voltage will not be excessively low relative to the design capacity calculated from the inherent capacity per unit weight of negative electrode 21.

The porosity of negative-electrode active-material layer 41 is preferred to be 15% to 60%, more preferably 15% to 40%.

A porosity lower than 15% may overly inhibit diffusion of lithium ions, and excellent battery characteristics are hard to obtain.

A porosity beyond 60% may cause contact failure between active materials or between active material and conductive additive, and battery characteristics may be lowered.

Moreover, since a greater porosity lowers the volumetric energy density, the above range is preferable.

Current collectors (30, 40) are electrically conductive, being formed with conductive material.

Examples of the material for forming current collectors (30, 40) are copper, aluminum, nickel, titanium, alloys of these metals, and conductive polymers.

Current collectors (30, 40) are made of foil, mesh, punched, expanded or foam materials. Conductive materials used for such current collectors may be any as long as they are stable at the active voltage of the electrode material. For the conductive material in a lithium-ion secondary battery related to the present embodiment, when the active voltage is 0.7 V or lower relative to a lithium reference electrode, copper or its alloy is preferred, and when the action potential is 0.7 V or higher, aluminum or its alloy is preferred.

(Binder)

The binder used in positive-electrode and negative-electrode active-material layers (31, 41) is not limited specifically as along as it is adhesive and dispersible in water or organic solvents.

A binder is at least one type selected from among polyvinylidene fluoride (PVdF), polytetrafluoroethylene (PTFE), tetrafluoroethylene-hexafluoropropylene copolymer (FEP), styrene-butadiene copolymer (SBR), polyacrylate, polyvinyl alcohol (PVA), carboxymethyl cellulose (CMC), polyimide (PI) and their derivatives. Dispersants and thickeners may be added.

(Conductive Additive)

A conductive additive in positive-electrode and negative-electrode active-material layers (31, 41) is not limited specifically, but carbon material and/or fine metal particles are preferred.

Examples of carbon material are natural or artificial graphite, gas-phase grown carbon fibers, carbon nanotubes, acetylene black, Ketjenblack, carbon black, furnace black and the like.

Examples of fine metal particles are those of copper, aluminum, nickel or alloys containing at least one of the above.

Fine particles may be those obtained by plating on inorganic materials. Carbon materials and fine metal particles listed above may be used alone or in combination thereof.

(Separator)

Separator 22 is obtained by impregnating electrolyte 23 into porous material, nonwoven fabric or the like.

The material for separator 22 is preferred to be those that do not dissolve in the organic solvent of electrolyte 23. Examples are polyolefins such as polyethylene and polypropylene; polyesters such as polyethylene terephthalate; cellulose; and inorganic materials such as glass.

The thickness of separator 22 is preferred to be 1 μm to 500 μm.

A thickness of less than 1 μm may cause breakage in separator 22 due to lack of mechanical strength, and internal short-circuiting tends to occur.

On the other hand, since a thickness exceeding 500 μm increases the internal resistance of battery 15 and extends the distance between positive and negative electrodes (20, 21), the power characteristics of battery 15 tend to be lowered. A more preferable thickness is 10 μm to 300 μm.

(Electrolyte)

Electrolyte 23 has metal-ion conductivity, and is capable of transferring metal ions for insertion/extraction between positive and negative electrodes (20, 21) as electrical conduction is carried out. Electrolyte 23 is nonaqueous, containing essentially no water.

Electrolyte 23 is not limited to any specific type; examples are an electrolyte prepared by dissolving a solute in a nonaqueous solvent; a gelated electrolyte prepared by impregnating a polymer with an electrolyte made by dissolving a solute in a nonaqueous solvent; a solid electrolyte; a pseudo-solid electrolyte obtained by mixing ionic liquid and silica particles; and the like.

Electrolyte 23 of the present embodiment is a nonaqueous liquid electrolyte prepared by dissolving a solute in a nonaqueous solvent, and is filled in package 27.

The nonaqueous solvent is preferred to contain a cyclic aprotic solvent and/or a non-cyclic aprotic solvent, more preferably a carbonate.

Examples of a cyclic aprotic solvent are cyclic carbonates, cyclic esters, cyclic sulfones, cyclic ethers and the like.

Examples of a non-cyclic aprotic solvent are non-cyclic carbonates, non-cyclic carboxylic acid esters, non-cyclic ethers and the like.

In addition to the aforementioned cyclic aprotic solvent and/or non-cyclic aprotic solvent, solvents generally used for nonaqueous electrolytes such as acetonitrile may also be used.

Specific examples are dimethyl carbonate, methyl ethyl carbonate, diethyl carbonate, dipropyl carbonate, methyl propyl carbonate, ethylene carbonate, propylene carbonate, butylene carbonate, γ-butyrolactone, 1,2-dimethoxyethane, sulfolane, dioxolane, methyl propionate and the like. They may be used alone or in combination thereof, but a mixture of two or more solvents is preferable since the solutes below are easier to dissolve and lithium ion conductivity is higher.

It is also an option to use a gelated electrolyte obtained by impregnating an electrolyte or ionic liquid into a polymer, a pseudo-solid electrolyte or sulfur-based solid electrolyte.

As for a solute, any compound is preferable as long as it contains lithium and halogen as its elements. More preferred examples are $LiClO_4$, $LiBF_4$, $LiPF_6$, $LiAsF_6$, $LiCF_3SO_3$, LiBOB (lithium bis(oxalato)borate), and $LiN(SO_2CF_3)_2$. When a solute is selected from the above, it is easier for them to dissolve in a solvent.

The concentration of the solute contained in electrolyte 23 is preferably 0.5 mol/L to 2.0 mol/L.

A solute concentration of lower than 0.5 mol/L in electrolyte 23 may fail to express desired ionic conductivity.

On the other hand, a solute concentration of higher than 2.0 mol/L in electrolyte 23 may not dissolve the excess amount of solute in the solvent.

A trace amount of additives such as a flame retardant and stabilizer may also be contained in electrolyte 23.

The amount of electrolyte 23 is not limited specifically, but is preferably 0.1 mL or more per 1 Ah of battery capacity.

If the amount of electrolyte 23 is less than 0.1 mL, it is hard for ionic conduction to track the progress of electrode reactions, and desired battery characteristics may not be expressed.

When a solid electrolyte is used, it may be compression molded, or it may be formed into a sheet by adding a binder used in electrodes (20, 21).

The positional relationships among component members are described below.

Positive-electrode active-material layer 31 of positive electrode (20a) faces negative-electrode active-material layer 41 of negative electrode (21a) by sandwiching separator 22 containing electrolyte 23. Positive-electrode active-material layer 31 of positive electrode (20b) faces negative-electrode active-material layer 41 of negative electrode (21b) by sandwiching separator 22 containing electrolyte 23. Positive-electrode active-material layer 31 of positive electrode (20c) faces negative-electrode active-material layer 41 of negative electrode (21c) by sandwiching separator 22 containing electrolyte 23.

The end portions of current collectors (30, 30) of positive-electrode members (10a, 10 b) are in contact with each other, and one positive-electrode member 10 of positive-electrode members (10a, 10b) is connected to terminal member 25.

In the same manner, end portions of current collectors (40, 40) of negative-electrode members (11a, 11b) are in contact with each other, and one negative-electrode member 11 of negative-electrode members (11a, 11b) is connected to terminal member 26.

Electrolyte 23 is filled in package 27, and impregnates separators 22.

Next, charge/discharge control is described as one of the characteristics of power storage device 1 according to the present embodiment.

For charge control of the present embodiment, external power-source system 50 is disconnected if necessary, and using only constant current charging, power-source control device 2 charges each of battery packs 5 in secondary battery system 3 until they reach the end-of-charge voltage. Namely, charge control of the present embodiment is conducted by power-source control device 2, which charges secondary batteries 15 of battery packs 5 pack by pack until they reach the end-of-charge voltage.

The charge rate at that time is preferred to be 1/16 C (one-sixteenth C) or higher, more preferably 1/12 C (one-twelfth C) or higher.

Moreover, the charge rate is preferred to be 1 C or lower, more preferably ½ C (one-half C) or lower, even more preferably ¼ C (one-quarter C) or lower.

Within the above range, charging does not take excessively long, and the component members of secondary batteries 15 do not have to bear an excessive load.

In the present embodiment, the batteries are charged at ⅛ C (one-eighth C).

When a cell with a known capacity is discharged at a constant current and the discharge is completed in an hour, the current value is "1 C" mentioned above.

The capacity of secondary battery 15 when charged at ⅛ C to the end-of-charge voltage is set to be 80% to 97% of the design capacity, preferably 90% or higher of the design capacity.

The "design capacity" above is calculated from inherent capacities per unit weight of positive and negative electrodes (20, 21).

Meanwhile, for the discharge control in the present embodiment, power storage device 1 is connected in parallel to external power-source system 50, and electricity is transmitted from power-source control device 2 to external power-source system 50 in response to the power demand from external power-source system 50. In discharge control of the present embodiment, unlike charge control, each battery pack 5 is set to output power not only at a constant current but at any other method corresponding to the demand from external power-source system 50; for example, battery pack 5 selected at random may be discharged under a constant wattage load or a constant resistance load.

Lastly, characteristics of secondary battery 15 of the present embodiment are described below, specifically characteristics when a specified number of charge/discharge cycles are repeated between the end-of-discharge voltage and end-of-charge voltage in power storage device 1 of the present embodiment.

When a charge/discharge cycle at a rate of ⅛ C is repeated 80 times on battery pack 5, its capacity decrease relative to the capacity prior to charge/discharge cycles is 2% or lower, preferably 0%. In other words, seemingly no decrease is observed in the capacity of battery pack 5 when a charge/discharge cycle at a rate of ⅛ C is repeated 80 times.

Similarly, when a charge/discharge cycle at a rate of ⅛ C is repeated 80 times on secondary batteries 15 in battery pack 5, their capacity decrease relative to the capacity prior to charge/discharge cycles is 2% or lower, preferably 1% or lower, more preferable 0%. In other words, secondary batteries 15 show seemingly no decrease in capacity when a charge/discharge cycle at a rate of ⅛ C is repeated 80 times.

When a charge/discharge cycle at a rate of ⅛ C is repeated 100 times on battery pack 5, its capacity decrease relative to the capacity prior to charge/discharge cycles is 2% or lower, preferably 1% or lower. In other words, battery pack 5 shows seemingly no decrease in capacity after 100 charge/discharge cycles repeated at a rate of ⅛ C.

Similarly, when a charge/discharge cycle at a rate of ⅛ C is repeated 100 times on secondary batteries 15 in battery pack 5, their capacity decrease relative to the capacity prior to charge/discharge cycles is 2% or lower, preferably 1% or lower, even more preferably 0%. In other words, secondary batteries 15 show seemingly no decrease in capacity when a charge/discharge cycle at a rate of ⅛ C is repeated 100 times.

Reasons are provided below as to why secondary battery 15 of the present embodiment shows seemingly no decrease in capacity when charge/discharge cycles are conducted under the above conditions.

In secondary battery 15 of battery pack 5, electrode active-material layers (31,41) of electrodes (20, 21) are thick, with an average thickness of 0.3 mm or greater. Thus, progress of charge reactions is limited by the rate of lithium-ion diffusion between electrodes (20, 21) and electrolyte 23.

Namely, of the two resistance components that give rise to the increase in voltage towards the later stage of charging, the diffusion resistance caused by diffusion of metal ions relating to battery reactions is greater relative to the contact resistance between materials, within secondary battery 15.

In secondary battery 15 of the present embodiment, electrode active-material layers (31, 41) are thick, with an average thickness of 0.3 mm or greater, thus raising diffusion resistance caused by the diffusion of metal ions relating to battery reactions and increasing the rate of voltage rise in the latter stage of charging. Accordingly, even when secondary battery 15 is seemingly in an overcharge state beyond the end-of-charge voltage, the voltage exerted on active-material layers (31, 41) in secondary voltage 15 is actually below the end-of-charge voltage. Therefore, it is thought that material damage and accelerated decomposition of electrolyte 23 caused by overcharge are suppressed from occurring in active-material layers (31, 41) of secondary battery 15, resulting in seemingly no capacity decrease.

Considered other viewpoints, since electrode active-material layers of electrodes (20, 21) are thick with an average thickness of 0.3 mm or greater, metal ions in electrolyte 23 are not sufficiently diffused all the way to the edge of negative-electrode active-material layer 41 even when the voltage reaches the end-of-charge voltage. Thus, the capacity is limited by the diffusion of metal ions. Accordingly, when capacity is decreased by decay of secondary battery 15, seemingly no capacity decrease is observed if the decrease is within a certain range. Namely, the voltage rise reflecting the diffusion resistance of metal ions is added to the voltage rise reflecting electromotive force and internal resistance of the secondary battery. Therefore, charge is completed before the secondary battery reaches the design capacity. In other words, when the design capacity is 100, due to the voltage rise reflecting diffusion resistance of metal ions, only a capacity of 80 is charged when secondary battery 15 reaches its end-of charge voltage by charging its actual full charge capacity.

A "full-charge capacity" means the rated capacity of a battery, and charging beyond that capacity is not recommended while the battery is in use.

Considering the above, if decay of secondary battery 15 causes the actual full-charge capacity to be decreased from 100 to 90, since the battery is charged up to 80 in the first place, it will be fully charged before it reaches 90. Therefore, it is thought that even when the performance of secondary battery 15 is lowered, such a state is not reflected in the capacity and seemingly no capacity decrease is thought to be observed.

According to power storage device 1 of the present embodiment, each of secondary batteries 15 is less likely to fall into a state of overcharge. Therefore, it is not necessary to control capacity variations battery by battery in secondary batteries 15, allowing charge/discharge of battery packs 5 to be conducted pack by pack, while eliminating a process of charging/discharging secondary batteries 15 battery by battery. Moreover, for the same reason as above, voltage monitoring and controlling of battery packs 5 are also performed pack by pack. In other words, it is not necessary to individually monitor the voltage of secondary batteries 15. Accordingly, battery pack 5 and battery system 3 are simplified and the cost is lowered.

Furthermore, according to power storage device 1 of the present embodiment, even when the end-of-charge voltage varies among secondary batteries 15 of battery pack 5, a state of overcharge is prevented from occurring in a certain secondary battery 15, and long-term battery stability is maintained. Namely, each of secondary batteries 15 in power storage device 1 exhibits excellent overcharge resistance, thus setting the entire device to have a long lifetime.

According to power storage device 1 of the present embodiment, power-source control device 2 individually controls each of battery packs 5. When power is requested by external power-source system 50, power-source control device 2 discharges any of battery packs 5 to transmit power based on the requested power. Moreover, since power-source control device 2 individually controls each of battery packs 5, charging is performed only on a battery pack 5 whose capacity is lowered after discharge.

In the above embodiment, power storage device 1 is interconnected to external power-source system 50 for transmitting power, although the present invention is not limited to such a system.

However, considering a long lifetime and higher safety of the device related to the present invention, it is preferred to arrange an interconnection to external power-source system 50 including a commercial power source.

In the above embodiment, negative electrode 21 of secondary battery 15 has a titanium-containing oxide as negative-electrode active material.

When a titanium-containing oxide is used as the negative-electrode active material, abnormal activity sites may occur in the titanium-containing oxide during charge/discharge cycles. Such abnormal active sites may cause decomposition of the solvent of electrolyte 23 and generate gas.

Accordingly, its opposing positive electrode 20 is preferred to include a positive-electrode active material mainly containing a lithium cobalt oxide capable of occluding the gas generated under a certain state of charge.

However, when positive electrode 20 includes a positive-electrode active material mainly containing a lithium cobalt oxide, the tolerance of the electrode towards overcharge is increased.

To express the effects of the present invention while suppressing gas formation, it is preferred for secondary battery 15 to use a positive electrode containing a lithium cobalt oxide and also to use another positive electrode coated with a different active material. Then, after those electrodes are simultaneously charged at a constant current to a certain current level while they are electrically insulated from each other, the positive electrode containing a lithium cobalt oxide is preferred to be disconnected.

More specifically, the other positive electrode as a first positive electrode is prepared to have as its main component at least one type of positive-electrode active material selected from among lithium manganese oxides and lithium manganese oxides obtained by replacing part of the manganese with a different element. A positive electrode containing a lithium cobalt oxide is prepared as a second positive electrode. In other words, the function of the first positive electrode is set to carry out normal charge/discharge, and the function of the second positive electrode is set to occlude gas. The second positive electrode is electrically insulated from the first positive electrode when the first and second positive electrodes are simultaneously charged to a certain current level, and the second positive electrode is then electrically disconnected.

By so setting, a charged second positive electrode is present in a secondary battery so that gas generated in the secondary battery is occluded by the second electrode containing a positive-electrode active material with a lithium cobalt oxide as its main component.

In the above embodiment, secondary battery 15 is formed by stacking secondary cells 17 structured to have positive electrode 20/separator 22/negative electrode 21. However, the present invention is not limited to such a structure.

A secondary battery may be formed by winding secondary cells having positive electrode/separator/negative electrode.

In the above embodiment, after secondary cells are stacked, they are encapsulated in a laminate film to form package 27. However, the present invention is not limited to such a structure.

When secondary battery 15 is formed by winding secondary cells 17, the wound battery may also be encapsulated in a laminate film to form package 27.

Alternatively, after secondary cells 17 are wound or laminated, they may be encapsulated by a rectangular, oval, cylindrical, coin- or button-like or sheet-type metal can.

In the above embodiment, a liquid nonaqueous electrolyte with lithium-ion conduction is used as electrolyte 23, which is impregnated in positive electrode 20, negative electrode 21 and separator 22. However, the present invention is not limited to such an electrolyte.

When a gelated nonaqueous electrolyte is used as electrolyte 23, it may be impregnated into positive and negative electrodes (20, 21), or may be present only between positive and negative electrodes (20, 21). Alternatively, not using separator 22 is also an option if gelated electrolyte 23 is positioned for preventing direct contact of positive and negative electrodes (20, 21).

In the above embodiment, positive and negative electrodes (20, 21) of secondary battery 15 are formed by forming positive-electrode active-material layer 31 and negative-electrode active-material layer 41 respectively on either surface or both surfaces of current collectors (30, 40). However, that is not the only option in the present invention.

For example, electrodes of secondary battery 15 may be formed by arranging positive-electrode active-material layer 31 on one side of a current collector and negative-electrode active-material layer 41 on the other side of the current collector. Namely, the electrode of secondary battery 15 may be bipolar electrodes having positive and negative electrodes (20, 21) respectively on both of its surfaces.

When the electrodes of a secondary battery are set to be bipolar, it is preferred to have an insulative material arranged between positive and negative electrodes to prevent electrolyte interaction between the positive and negative electrodes through the current collector.

When the electrodes of a secondary battery are bipolar, a separator is preferred to be positioned between positive and negative electrodes of adjacent bipolar electrodes, and the layer where positive and negative electrodes face each other is preferred to have an insulative material arranged around those electrodes to prevent electrolyte interaction between successive electrodes.

In secondary battery system 3 of the above embodiment, three battery packs 5 are connected parallel to power-source control device 2. However, that is not the only option.

Depending on desired size and voltage, secondary battery system 3 may have a desired number of battery packs 5 connected either in series or parallel relative to power-source control device 2.

The number of packs connected in parallel is not limited specifically, and secondary power-source system 3 may be designed as desired according to usage purposes.

The above embodiment describes secondary battery 15 as a lithium-ion secondary battery. However, that is not the only option, and secondary battery 15 may be any other type as long as it is charged/discharged through metal-ion conduction. For example, secondary battery 15 may be a sodium-ion secondary battery, or polyvalent ion secondary batteries such as a magnesium-ion secondary battery and aluminum/air battery.

In the above embodiment, terminal members (25, 26) are extended respectively in opposite directions from package 27 of secondary battery 15. However, it is also an option for terminal members (25, 26) to be extended in the same direction from package 27.

In the above embodiment, secondary batteries 15 of battery packs 5 are all the same type. However, the present invention is not limited to such a structure.

One battery pack 5 may be formed using lithium-ion secondary batteries while another battery pack 5 is formed using sodium-ion secondary batteries. In addition, the capacity of each battery pack 5 may be set differently.

In the above embodiment, the same charge/discharge rate is employed for charging/discharging battery packs 5. However, battery packs 5 may also be charged/discharged at different rates.

EXAMPLES

In Examples 1~7 and Comparative Examples 1~4, secondary batteries were prepared by the following methods, and their characteristics were evaluated, with evaluation criteria as described in Table 1.

(1) Preparing Secondary Battery

Per 100 parts by weight of powdered electrode active-material, which is $Li_{1.1}Al_{0.1}Mn_{1.8}O_4$ (hereinafter also referred to as LAMO), $LiNi_{0.5}Mn_{1.5}O_4$ (hereinafter also referred to as LiNiMO) or $Li_4Ti_5O_2$ (hereinafter may also be referred to as LTO), 6.8 parts by weight of a conductive additive (acetylene black) and 6.8 parts by weight of a binder in terms of solid content were mixed to prepare an active-material mixture. Electrodes were formed using the mixture, and secondary batteries were further formed by using the obtained electrodes.
(Producing Powder of Electrode Active Materials)

Electrode active materials were produced as follows.

$Li_{1.1}Al_{0.1}Mn_{1.8}O_4$ (LAMO) as a positive-electrode active material was produced by the method described in a literature (Electrochemical and Solid-State Letters, 9(12), A557 (2006)).

A mixed powder was obtained by preparing an aqueous dispersion of manganese dioxide, lithium carbonate, aluminum hydroxide and boric acid, which was then spray-dried.

The molar ratio of lithium, aluminum and manganese was set at 1.1:0.1:1.8. Next, the mixed powder was heated at 900° C. for 12 hours and further heated at 650° C. for 24 hours in an air atmosphere. Lastly, the powder was washed with 95° C. water and dried. Accordingly, a powdered positive-electrode active material was obtained.

$LiNi_{0.5}Mn_{1.5}O_4$ (LiNiMO) as a positive-electrode active material was produced by the method described in a literature (Journal of Power Sources, 81-82, 90 (1999)).

First, lithium hydroxide, manganese oxide hydroxide and nickel hydroxide were mixed at a molar ratio of lithium, manganese and nickel of 1:1.5:0.5. Next, the mixture was heated at 550° C. and further heated at 750° C. in an air atmosphere. Accordingly, a powdered a positive-electrode active material was obtained.

$Li_4Ti_5O_{12}$ (LTO) as a negative-electrode active material was produced by the method described in a literature (Journal of Electrochemical Society, 142, 1431 (1995)).

First, titanium dioxide and lithium hydroxide were mixed at a molar ratio of titanium and lithium of 5:4. Next, the mixture was heated at 800° C. for 12 hours in a nitrogen atmosphere. Accordingly, a powdered negative-electrode active material was obtained.

The average particle sizes of active materials were found to be LAMO: 16 μm, LiNiMO: 11 μm and LTO: 7 μm when measured through laser diffraction analysis by using a particle size distribution measuring apparatus.
(Forming Active-Material Mixture and Electrode)

The method for mixing active materials and the method for forming electrodes are shown below.

First, the electrode active materials were each mixed with a conductive additive using an automatic mortar. The mixed powder was transferred to a stainless-steel bowl, to which a binder dispersed in water was added, and preliminarily mixed using an alumina pestle. Then, water and other solvent were added to make a solid concentration of 80%, which was mixed again. Accordingly, an active-material mixture was obtained.

Next, the active-material mixture was dispersed on an aluminum expanded metal (mesh opening of 1 mm×2 mm, thickness of 0.1 mm), which was then molded by compressing the mixture from above.

Then, the molded material was vacuum dried at 170° C. and an electrode was obtained. The thickness of the electrode including the dried aluminum expanded metal was approximately 1.0 mm.
(Forming Secondary Battery)

Positive electrodes were formed using LAMO or LiNiMO, and negative electrodes were formed using LTO.

First, a stack was prepared by stacking the above obtained electrodes in the order of positive electrode/separator/negative electrode. Two sheets of cellulose nonwoven fabric (25 μm thick) were used as a separator.

Next, after aluminum tabs were vibration-welded to make extended electrodes of positive electrodes and negative electrodes, the stack with tabs was placed in a bag-shaped aluminum laminate sheet.

To measure the capacity of each positive and negative electrode, a lithium metal electrode was used as the negative electrode, formed by crimping a lithium metal to a stainless-steel sheet, to which a nickel tab was vibration-welded.

A nonaqueous electrolyte (propylene carbonate/ethyl methyl carbonate=3/7 vol %, 1 mol/L $LiPF_6$) was filled in the bag containing the stack, and the opening of the bag was thermally sealed with the extended electrodes protruding therefrom to obtain a nonaqueous electrolyte secondary battery.

The inherent capacity per unit weight of electrodes measured by charging/discharging the secondary battery was LAMO: 100 mAh/g, LiNiMO: 130 mAh/g, and LTO: 165 mAh/g.
(2) Performance Evaluation of Secondary Battery A secondary battery was formed using LAMO or LiNiMO for the positive electrode and LTO for the negative electrode. Then, a single secondary battery or a battery pack containing the same type of secondary batteries connected in series was sandwiched with metal plates on the outer side of the package, and a charge/discharge cycle test was conducted at a current value that completes charge/discharge in 8 hours (rate of ⅛ C). Namely, when a current flowing at a point of a battery pack connected in series was referred to as (IC) (charge), the current (IC) flowing through all the secondary batteries in the battery pack was set at ⅛ C for charging/discharging all the secondary batteries in the pack.

In the above charge/discharge cycle test, the cycle was repeated 100 times. The voltage for a single secondary battery or a single secondary battery pack positioned at either end was monitored, and the test was controlled by cutting off charging when the battery reached the end-of-charge voltage and cutting off discharging when the battery reached at the end-of-discharge voltage.

For each single battery or battery pack, the end-of-charge voltage, end-of-discharge voltage, ratio of actual capacity/design capacity, and capacity retention rate are shown in Table 1.

TABLE 1

| | Type of positive electrode | Thickness of positive electrode (mm) | Porosity of positive electrode (%) | Type of negative electrode | Thickness of negative electrode (mm) | Porosity of negative electrode (%) | Number of connections in series | End-of-charge voltage (V) | End-of-discharge voltage (V) | Charge/discharge mode | Ratio measured capacity/design capacity (%) | Capacity retention rate (%) |
|---|---|---|---|---|---|---|---|---|---|---|---|---|
| Example 1 | LAMO | 0.3 | 35 | LTO | 0.3 | 35 | 1 | 2.8 | 2.2 | CC | 95 | 100 |
| Example 2 | LAMO | 0.5 | 35 | LTO | 0.5 | 35 | 1 | 2.8 | 2.2 | CC | 93 | 100 |
| Example 3 | LAMO | 1.0 | 35 | LTO | 1.0 | 35 | 1 | 2.8 | 2.2 | CC | 90 | 100 |

TABLE 1-continued

| | Type of positive electrode | Thickness of positive electrode (mm) | Porosity of positive electrode (%) | Type of negative electrode | Thickness of negative electrode (mm) | Porosity of negative electrode (%) | Number of connections in series | End-of-charge voltage (V) | End-of-discharge voltage (V) | Charge/discharge mode | Ratio measured capacity/design capacity (%) | Capacity retention rate (%) |
|---|---|---|---|---|---|---|---|---|---|---|---|---|
| Example 4 | LAMO | 2.0 | 35 | LTO | 2.0 | 35 | 1 | 2.8 | 2.2 | CC | 81 | 100 |
| Example 5 | LAMO | 1.0 | 35 | LTO | 1.0 | 35 | 5 | 14 | 11 | CC | 90 | 100 |
| Example 6 | LiNiMO | 0.3 | 35 | LTO | 0.3 | 35 | 1 | 3.5 | 2.7 | CC | 90 | 100 |
| Example 7 | LiNiMO | 1.0 | 35 | LTO | 1.0 | 35 | 1 | 3.5 | 2.7 | CC | 84 | 100 |
| Comp. Example 1 | LAMO | 0.2 | 35 | LTO | 0.2 | 35 | 1 | 2.8 | 2.2 | CC | 100 | 100 |
| Comp. Example 2 | LAMO | 0.3 | 35 | LTO | 0.3 | 35 | 5 | 14 | 11 | CCCV | 100 | 88 |
| Comp. Example 3 | LAMO | 0.2 | 35 | LTO | 0.2 | 35 | 5 | 14 | 11 | CC | 100 | 91 |
| Comp. Example 4 | LAMO | 1.0 | 10 | LTO | 1.0 | 10 | 1 | 2.8 | 2.2 | CC | 72 | 92 |

Examples 1~5

Examples 1~5 are each a secondary battery using LAMO for the positive electrode and LTO for the negative electrode (hereinafter may also be referred to as LTO/LAMO secondary battery); positive and negative electrodes each have a thickness of 0.3 mm or greater and a porosity of 35%.

A single battery was used in Examples 1~4, and a battery pack with five single batteries connected in series was used in Example 5.

When secondary batteries in Examples 1~5 reached an end-of-charge voltage of 2.8 V, the actual capacity of each secondary battery was lower than the design capacity calculated from the inherent capacity per unit weight of the battery.

The reason is thought to be because the diffusion of lithium ions cannot keep up the progress of electrode reactions, and concentration polarization occurs, increasing the actual voltage rise. In other words, the rate of charge reactions in secondary batteries of Examples 1~5 is limited by the diffusion of lithium ions, and an increase in actual voltage rise is thought to be caused by the diffusion resistance.

Moreover, when capacities were measured under the above conditions, the capacity retention rate in Examples 1~5 was 100% after 100 cycles.

Namely, under conditions including concentration polarization of electrolyte and the internal resistance, even when the voltage generated in each secondary battery of Examples 1~5 is seemingly in a state of overcharge beyond the end-of-charge voltage, the voltage exerted on the active-material layers is actually below the end-of-charge voltage. As a result, acceleration in material damage and electrolyte decomposition is thought to be suppressed. Accordingly, secondary batteries of Examples 1~5 have a long lifetime.

Moreover, Example 5 used a battery pack with five secondary batteries connected in series. When the battery pack was controlled to switch to discharging at the time it reached the end-of-charge voltage, the capacity retention rate was the same.

When secondary batteries were connected in series, the voltage of each secondary battery was assumed to be different when charge was completed, and voltage rise reflecting the concentration polarization of electrolyte is included the same as in single batteries. Thus, acceleration in material damage and electrolyte decomposition is thought to be suppressed, and capacity is not lowered.

Examples 6, 7

Examples 6 and 7 are each a secondary battery using LiNiMO for the positive electrode and LTO for the negative electrode (hereinafter may also be referred to as LTO/LiNiMO secondary battery); positive and negative electrodes each have a thickness of 0.3 mm or greater and a porosity of 35%.

When charge/discharge cycle test was conducted on LTO/LiNiMO secondary batteries of Examples 6 and 7 under conditions of constant current and an end-of-charge voltage of 3.5 V, the capacity did not reach 100% of the design capacity due to the impact from lithium-ion diffusion, and an excellent capacity retention rate was achieved.

Comparative Examples 1~4

Comparative Examples 1 and 3 are each a secondary battery using LAMO for the positive electrode and LTO for the negative electrode; positive and negative electrodes each have a thickness of 0.2 mm and a porosity of 35%.

The LTO/LAMO secondary battery was used as a single battery in Comparative Example 1, and a battery pack with five single batteries connected in series was used in Comparative Example 3.

The ratio of measured capacity/design capacity was 100% in Comparative Examples 1 and 3, and the capacity was obtained as designed. Since the electrodes are thinner, the concentration polarization of electrolyte has a smaller impact on voltage rise in the latter stage of charging, and all the lithium ions of the active material were extracted/inserted before greater concentration polarization occurs. Accordingly, it is thought that the capacity was obtained as designed.

When charge/discharge was conducted at a constant current on a single battery as in Comparative Example 1, an excellent capacity retention rate was obtained, whereas the capacity retention rate was lower when five secondary batteries were connected in series as shown in Comparative Example 3. When connected in series, voltage rise is not uniform in those secondary batteries, and the impact of concentration polarization of electrolyte is insignificant. Accordingly, a greater load is thought to be exerted on the secondary battery that first reaches the end-of-charge voltage, leading to deterioration of active material and decomposition reactions of electrolyte, thereby resulting in a lower capacity retention rate.

Comparative Example 2 is an LTO/LAMO secondary battery using LAMO for the positive electrode and LTO for the negative electrode; positive and negative electrodes each have a thickness of 0.3 mm and a porosity of 35%.

In Comparative Example 2, five single batteries were connected in series to form a battery pack. The battery pack was charged at a constant current until it reached the end-of-charge voltage. Then, the battery was charged at a constant voltage while maintaining the end-of-charge voltage until the current value reached 1/40 C (CCCV).

The ratio of measured capacity/design capacity was 100% at the completion of charge, achieving the capacity designed for Comparative Example 2. However, its capacity retention rate was lower.

Since voltage rise varies in secondary batteries connected in series, a greater load exerted on a secondary battery which first experienced voltage rise. Accordingly, it is thought that capacity was decreased due to deterioration of active material and decomposition of electrolyte on electrode surfaces.

Comparative Example 4 is an LTO/LAMO secondary battery using LAMO for the positive electrode and LTO for the negative electrode; positive and negative electrodes each have a thickness of 1.0 mm and a porosity of 10%.

The ratio of measured capacity/design capacity was 72% at the time of charge completion, and the capacity retention rate was low at 92% in Comparative Example 4. A smaller porosity rate of the LTO/LAMO secondary battery of the Comparative Example 4 causes a lower diffusion rate of metal ions in the electrolyte. Thus, it is thought that reactions are more likely to occur locally and it is difficult to express the design capacity.

From the results above, it is found that by setting active-material layers of positive and negative electrodes to have an average thickness of 0.3 mm or greater, reaction rates at the active-material layers of positive and negative electrodes are limited by the rate of lithium-ion diffusion. Accordingly, when a secondary battery under such conditions is charged only at a constant current, material deterioration in the active-material layers is less likely to occur even after a charge/discharge cycle is repeated 80 times at a current value for completing charge or discharge in 8 hours, and virtually no capacity decrease is observed in the secondary battery.

DESCRIPTION OF NUMERICAL REFERENCES 1 power storage device
2 power-source control device
5 battery pack
10 positive-electrode member
11 negative-electrode member
20 positive electrode
21 negative electrode
22 separator
23 electrolyte
31 positive-electrode active material
41 negative-electrode active material
50 external power-source system

What is claimed is:

1. A power storage device, comprising:
at least one secondary battery having a plurality of positive electrodes, a plurality of negative electrodes, and a nonaqueous electrolyte that allows a metal ion to move between the positive and negative electrodes through the nonaqueous electrolyte, the positive and negative electrodes being configured to be charged/discharged when insertion/extraction reactions of the metal ions are carried out through the nonaqueous electrolyte; and
a charging device configured to charge the secondary battery only at a constant current until the secondary battery reaches an end-of-charge voltage and has a capacity being from 80% to 97% of a design capacity of the secondary battery when the charging device stops charging the secondary battery at the end-of-charge voltage,
wherein each of the positive electrodes includes a positive-electrode current collector and at least one positive-electrode active-material layer having an average thickness of 0.3 mm or greater and formed such that a voltage exerted on the positive-electrode active-material layer is below the end-of-charge voltage when the secondary battery reaches the end-of-charge voltage,
each of the negative electrodes includes a negative-electrode current collector and at least one negative-electrode active-material layer having an average thickness of 0.3 mm or greater and formed such that a voltage exerted on the negative-electrode active-material layer is below the end-of-charge voltage when the secondary battery reaches the end-of-charge voltage,
the secondary battery has a structure where i) one of the positive electrodes includes a plurality of positive-electrode active material layers formed on both sides of the positive-electrode current collector and is positioned between two of the negative electrodes or ii) one of the negative electrodes includes a plurality of negative-electrode active material layers formed on both sides of the negative-electrode current collector and is positioned between two of the positive electrodes, and
the active-material layer of the positive and negative electrodes has a porosity of 15% or higher.

2. The power storage device of claim 1, wherein the secondary battery is configured such that a decrease in capacity is 2% or less after 80 charge/discharge cycles at a current that completes a charge or discharge in 8 hours at a voltage between the end-of-discharge voltage and the end-of-charge voltage.

3. The power storage device of claim 1, wherein the at least one secondary battery comprises a plurality of secondary batteries packed in a plurality of battery packs each including secondary batteries connected in series, and the charging device is configured to charge the secondary batteries pack by pack.

4. The power storage device of claim 2, wherein the at least one secondary battery comprises a plurality of secondary batteries packed in a plurality of battery packs each including secondary batteries connected in series, and the charging device is configured to charge the secondary batteries pack by pack.

5. The power storage device of claim 3, wherein the charging device is configured to monitor and control a voltage pack by pack while charging the battery packs.

6. The power storage device of claim 4, wherein the charging device is configured to monitor and control a voltage pack by pack while charging the battery packs.

7. The power storage device of claim 1, wherein the power storage device is configured to supply power to an external power-source system.

8. The power storage device of claim 2, wherein the power storage device is configured to supply power to an external power-source system.

9. The power storage device of claim 4, wherein the power storage device is configured to supply power to an external power-source system.

10. The power storage device of claim 6, wherein the power storage device is configured to supply power to an external power-source system.

11. The power storage device of claim 1, wherein the secondary battery is dischargeable at a constant current.

12. The power storage device of claim 1, wherein the secondary battery is dischargeable at a current other than a constant current.

13. The power storage device of claim 1, wherein the nonaqueous electrolyte includes a solvent comprising a carbonate and having a solute dissolved therein.

14. The power storage device of claim 13, wherein the solute is a compound including lithium and halogen.

15. The power storage device of claim 1, wherein the negative-electrode active-material layer of each of the negative electrodes comprises lithium titanium oxide, or a compound having a different metal ion replacing an ion of lithium titanium oxide.

16. The power storage device of claim 2, wherein the negative-electrode active-material layer of each of the negative electrodes comprises lithium titanium oxide, or a compound having a different metal ion replacing an ion of lithium titanium oxide.

17. The power storage device of claim 1, wherein the positive-electrode active-material layer of each of the positive electrodes comprises lithium manganese oxide, or a compound having a different metal ion replacing an ion of lithium manganese oxide.

18. The power storage device of claim 2, wherein the positive-electrode active-material layer of each of the positive electrodes comprises lithium manganese oxide, or a compound having a different metal ion replacing an ion of lithium manganese oxide.

19. The power storage device of claim 1, wherein the positive-electrode active-material layer and the negative-electrode active-material layer of each of the positive and negative electrodes has an average thickness of 1.0 mm or greater.

* * * * *